United States Patent [19]

Noguchi

[11] 4,441,973

[45] Apr. 10, 1984

[54] METHOD FOR PREPARING A THIN FILM AMORPHOUS SILICON HAVING HIGH RELIABILITY

[75] Inventor: Kesao Noguchi, Tokyo, Japan

[73] Assignee: Nippon Electric Co., Ltd., Tokyo, Japan

[21] Appl. No.: 287,940

[22] Filed: Jul. 29, 1981

[30] Foreign Application Priority Data

Jul. 30, 1980 [JP] Japan ................................. 55-104518

[51] Int. Cl.³ ............................................ C23C 15/00
[52] U.S. Cl. .................................. 204/192 N; 357/2; 357/4; 427/38; 427/39; 427/86
[58] Field of Search ............... 204/192 N; 427/86, 39, 427/38; 357/2, 4

[56] References Cited

U.S. PATENT DOCUMENTS 4,196,438  4/1980  Carlson .................................. 427/39
4,225,222  9/1980  Kempter ............................... 427/39
4,226,898 10/1980  Ovshinsky ............................. 357/2
4,292,343  9/1981  Plaettner .............................. 427/86

OTHER PUBLICATIONS

Matsumura et al., Applied Phys. Letters; vol. 26, Mar. 15, 1980, pp. 445–446.

Primary Examiner—Arthur P. Demers
Attorney, Agent, or Firm—Laff, Whitesel, Conte & Saret

[57] ABSTRACT

A semiconductor film is prepared by a method wherein a substrate is first disposed as one electrode within a reaction chamber. A supply of semiconductor material is fed into the reaction chamber as the other electrode while introducing a fluoride semiconductor material into said reaction chamber. A high frequency electric field is generated within the reaction chamber to ionize the semiconductor material and decompose the fluoride of the semiconductor material, whereby an amorphous semiconductor film is deposited on the substrate.

23 Claims, 13 Drawing Figures

METHOD FOR PREPARING A THIN FILM AMORPHOUS SILICON HAVING HIGH RELIABILITY

BACKGROUND OF THE INVENTION

The present invention relates to a method for the preparation of an amorphous semiconductor film, and more particularly to a method of depositing a fluorinated amorphous silicon thin film.

Research has been proposed for practical applications of an amorphous silicon (hereinafter abbreviated as a-Si) film as a material for optoelectric energy conversion devices. This is because there is associated with the favorable property of a large coefficient of optical absorption as compared to crystalline silicon films. For example, the coefficient of optical absorption of an a-Si film is larger by about one decimal order than that of a mono-crystalline silicon film at the proximity of the peak of the solar spectrum. Therefore, even if the film thickness is reduced, the a-Si film can achieve an acceptable photo-electric energy conversion. Moreover, various substrates such as a metal substrate, a glass substrate, etc. can be chosen, unlike the substrate for a crystalline silicon film, as a substrate for depositing a-Si film thereon, whereas the substrate for a crystalline silicon film is limited to a crystalline silicon substrate.

In view of the aforementioned merits, solar cells using amorphous silicon are possible to reduce their material cost by about two decimal orders, as compared with the crystalling silicon solar cells. In addition, owing to the fact that a-Si films have a large coefficient of optical absorption, their applications to an image sensor in a facsimile apparatus and to thin film transistors for driving a liquid crystal display, are now being studied.

Although the a-Si film has excellent properties as described above, the film has some disadvantages caused by the existence of many dangling bonds therein. It is impossible to form a PN-junction and to control electric conductivity by doping impurities into the film because of the dangling bonds. However, an a-Si film prepared by the glow discharge decomposition process using a silane (SiH4) gas, has very few dangling bonds. This is surmised from the fact that hydrogen atoms trapped in the film compensate for the dangling bonds.

More particularly, the a-Si film prepared by the glow discharge decomposition of the silane gas contains about 10 to 40% hydrogen. The hydrogen ratio depends upon the preparation conditions. It is seen from the infrared absorption spectrum that the trapped hydrogen atoms form Si-H bonds. The hydrogen atoms forming such bonds are considered to serve as bonding partners for the dangling bonds. The hydrogen atoms compensate the dangling bonds to reduce a density of localized states in an energy gap to about $10^{16}$ cm$^{-3}\cdot$eV$^{-1}$. Thus, since the density of localized states is small, in amorphous silicon prepared by a glow discharge, the substitutive impurity doping is possible. Hence, the formation of a PN-junction as well as the control of an electric conductivity is possible.

However, the bonding energy of the Si-H bond is as small as about 3.5 eV. Hence, the dissociation of H from Si begins due to lattice vibrations which are caused by the heat above 350° C. Furthermore, the dissociation of H from Si is also caused by the collision of carriers excited by intense light energy or carriers energized by the intense electric field applied to the lattice. Thus, the a-Si film including hydrogen is poor in the thermal stability, optical stability and electric field stability. Consequently, the above-described devices using a-Si film containing hydrogen as a film material have low reliability, and no guarantee of long life.

It has been proposed that the dangling bonds be compensated by fluorine which has a bonding energy (about 5.6 eV) that is larger than the bonding energy of hydrogen. The resulting a-Si film would have enhanced reliability and thermal stability.

However, as will be apparent from a description below, an a-Si film cannot be formed by the glow discharge decomposition method, employing only a silicon tetrafluoride gas. This face it unavoidable in the glow discharge decomposition method. In order to produce an a-Si film containing fluorine by the glow discharge decomposition method, it is essentially necessary to use a silane gas or a hydrogen gas in addition to silicon tetrafluoride gas. As a result, hydrogen cannot be excluded from an a-Si film. Therefore, the improvement in the reliability of devices employing a-Si films produced by the glow discharge method is not expected.

A method for producing an a-Si film not containing hydrogen at all has also been proposed. This proposed method employs a high frequency, two-electrode, sputtering apparatus. A silicon target is sputtered in a mixed gas atmosphere containing a silicon tetrafluoride gas and an argon gas. The sputtering deposits an a-Si film on a substrate. At the present time, in order to sputter the silicon target, it is necessary to make the proportion of the argon gas 90% or more of the mixed gas. As a result, 2–6% argon is contained in the deposited a-Si film. If argon is contained in the film, structural defects result. Moreover, due to the sputtering of a-Si film many additional structural defects would be produced in the a-Si film. For this reason, although hydrogen free a-Si film can be produced by the sputtering method, the prepared a-Si film is inferior to the film produced by the glow discharge decomposition method in the electrical properties such as a photo-conductivity and the like due to the structural defects.

SUMMARY OF THE INVENTION

It is, therefore, one object of the present invention to provide a method for producing a highly reliable amorphous silicon film containing fluorine and not containing either hydrogen or argon.

Another object of the present invention is to provide a method for depositing an amorphous silicon thin film whose reliability is increased without deterioration of its electrical properties.

The method for producing an a-Si film according to the present invention employs a high frequency ion-plating method. Normally, in the ion-plating method, a film forming chamber is supplied with a discharge exciting gas such as argon. In such a gas atmosphere, an evaporation source of a film material is set as an anode and a substrate on which a film is to be formed is set as a cathode. A coil-shaped high frequency electrode is disposed between the anode and cathode to generate a high frequency electric field. Then, atoms evaporated from the evaporation source are ionized under the discharging condition caused by the high frequency electric field. The ionized atoms are attracted and accelerated towards the substrate due to a negative potential applied to the substrate. A film is thus deposited on the surface of the substrate.

Such an ion-plating method has characteristics such that a high frequency discharge can arise, even in a relatively high vacuum, and that the evaporated atoms can be ionized by the high frequency discharge. Another characteristic of this method is that the evaporation system, the ionization system and the acceleration system, can all be controlled independently.

However, in preparing an a-Si film by making use of the ion-plating process, argon would be contained in the deposited a-Si film because the argon gas is employed for exciting the discharge. Consequently, new structural defects would be generated as described previously.

As a result of a detailed investigation on the preparation of a-Si films by an ion-plating process, the inventor has discovered that the silicon evaporated from the evaporation source can be partly ionized by means of the high frequency electric field even without introducing an argon gas. This is accomplished by setting the total gas pressure within the film forming chamber to a pressure range which is higher than $1 \times 10^{-4}$ and lower than $3 \times 10^{-2}$ Torr. The ionized silicon is detected as an ion current. Furthermore, it has been discovered that an a-Si film containing fluorine in an amount necessary for compensating the dangling bonds and not containing either hydrogen or argon can be formed by introducing a silicon tetrafluoride gas into the film forming chamber such that its partial pressure ratio is in a range of $2.5 \times 10^{-3}$ to $9.7 \times 10^{-1}$. "Partial pressure ratio" is defined in this specification as a ratio of a partial pressure of the introduced silicon tetrafluoride gas to a sum of partial pressures of the evaporated silicon gas and the introduced silicon tetrafluoride gas. It is expressed mathematically as $[SiF_4]/([Si]+[SiF_4])$.

The a-Si film deposited by the ion-plating method, under an adequately selected partial pressure ratio of the silicon tetrafluoride gas, has a high thermal stability without deterioration of electrical properties. This is because the film contains no hydrogen and argon. As a result, devices making use of the a-Si film obtained by the method, according to the present invention, are highly reliable and long in life, and further are excellent in a photo-conductivity.

BRIEF DESCRIPTION OF THE DRAWINGS

The above-mentioned and other objects, features and advantages of the present invention will become more apparent by reference to the following description of the invention taken in conjunction with the accompanying drawings, wherein:

FIG. 1 is a diagram showing a film deposition rate as a function of a partial pressure ratio $$\left(\frac{[SiF_4]}{[SiH_4]+[SiF_4]}\right)$$

of a partial pressure of silicon tetrafluoride gas to a sum of a partial pressure of a silane gas and the partial pressure of the silicon tetrafluoride gas, as observed in the well-known glow discharge decomposition method;

FIG. 2 is a diagram showing atomic concentrations of hydrogen (H) and fluorine (F) contained in a deposited film as a function of the partial pressure ratio $$\left(\frac{[SiF_4]}{[SiF_4]+[SiF_4]}\right)$$

as defined above in connection to FIG. 1;

FIG. 3 is a diagram showing a film deposition rate as a function of partial pressure ratio $$\left(\frac{[SiF_4]}{[H_2]+[SiF_4]}\right)$$

of a partial pressure of a silicon tetrafluoride gas to a sum of a partial pressure of a hydrogen gas and the partial pressure of the silicon tetrafluoride gas, as observed in the glow discharge decomposition method, employing the hydrogen gas in place of the silane gas in FIG. 1;

FIG. 4 is a diagram showing atomic concentrations of hydrogen (H) and fluorine (F) contained in a deposited film as a function of the partial pressure ratio $$\left(\frac{[SiF_4]}{[H_2]+[SiF_4]}\right)$$

as defined above in connection with FIG. 3;

FIG. 7 is a diagram showing a film deposition rate as a function of the above defined partial pressure ratio $$\left(\frac{[SiF_4]}{[Si]+[SiF_4]}\right)$$

of the silicon tetrafluoride gas, as observed in the method according to the present invention;

of the silicon tetrafluoride gas;

FIG. 10 is a diagram showing an infrared transmission characteristic as a function of a wave number taking the partial pressure ratio $$\left(\frac{[SiF_4]}{[Si] + [SiF_4]}\right)$$

of the silicon tetrafluoride gas as a parameter;

FIG. 11 is a diagram showing an infrared transmission characteristic as a function of a wave number taking the partial pressure ratio $$\left(\frac{[SiF_4]}{[Si] + [SiF_4]}\right)$$

and an acceleration voltage $V_{acc}$ as parameters;

DETAILED DESCRIPTION OF THE PRIOR ART

Prior to a detailed description of the present invention, a method for producing an a-Si film by the prior art will be described in more detail. It was already mentioned above, as a conclusion, that an a-Si film containing fluorine without hydrogen cannot be formed by the glow discharge decomposition method. This conclusion can be explained from the fact that the thin film deposition mechanism of the glow discharge method is similar to that of the chemical vapor deposition method.

More particularly, in the glow discharge decomposition method, a D.C. or high frequency electric field is generated by either inductive or capacitive coupling within the SiH$_4$ gas or within the mixed gas consisting of SiH$_4$ and H$_2$. The gases have a pressure of about 0.1 Torr to several Torr. The SiH$_4$ is decomposed by a glow discharge plasma that has been excited by the generated electric field. The bond between a silicon atom and another silicon atom (Si—Si bonds) is then successively formed on a substrate heated to 200°–400° C., so that an a-Si film is deposited on the substrate. Thus, the formation of the film by the glow discharge decomposition method is achieved by forming Si—Si bonds. The following is a description of a film growth system employing the silane gas or the mixed gas consisting of silane and hydrogen gases. A relationship of H—H>Si—H>Si—Si is present among relative bonding strengths between the respective atoms as represented by H—H, Si—H and Si—Si. Accordingly, H atoms in the gas atmosphere will combine with H atoms on the surface of the substrate, even if Si—H bonds are formed on the substrate to cover the surface of the substrate with the H atoms. As a result, the H atoms on the surface are removed as a hydrogen gas H$_2$. Therefore, Si atoms bond at the vacancies where the H atoms are removed. Thus, Si—Si bonds are formed. In this way, an a-Si film is formed by the glow discharge decomposition method employing the silane gas or the mixed gas of silane and hydrogen gases.

Whereas, the growth mechanism of the film formed by the glow discharge decomposition method employing only a SiF$_4$ gas causes a relationship of Si—F>Si—Si>F—F among the bonding between the respective atoms as represented by Si—F, Si—Si and F—F. Hence, if Si—F bonds are formed on the substrate surface and the surface is then covered by F atoms, Si—Si bonds would not be able to form. Consequently, an a-Si film cannot be formed on the substrate.

A growth mechanism in the glow discharge decomposition method employs a mixed gas of a SiF$_4$ gas added to either a silane gas or a hydrogen gas. The relationship of H—F>Si—F>H—H>Si—H>Si—Si>F—F is present among the relative bonding strength between the respective atoms, as represented by H—F, Si—F, H—H, Si—H, Si—Si and F—F. Accordingly, even if the substrate surface is covered by F atoms, H—F bonds would be formed by H atoms in the mixed gas, so that the F atoms on the substrate surface would be removed as an HF gas. Consequently, Si—Si bonds can be formed successively from the substrate surface, and thereby an a-Si film is formed. As described above, in order to deposit an a-Si film containing fluorine, either the hydrogen gas or the silane gas is essential. As a result, hydrogen as well as fluorine is present in the resulting a-Si film.

Figure 1:
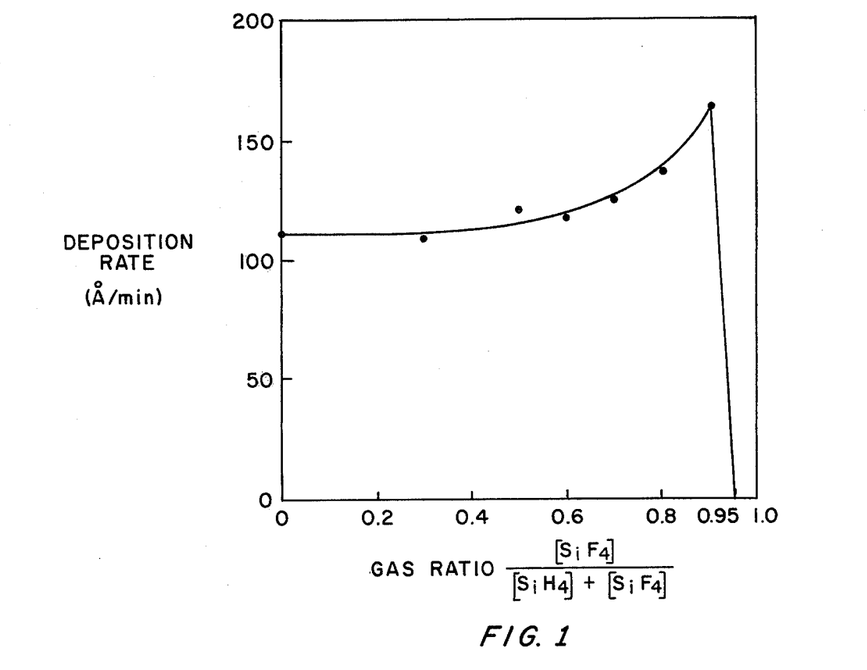
Figure 2:
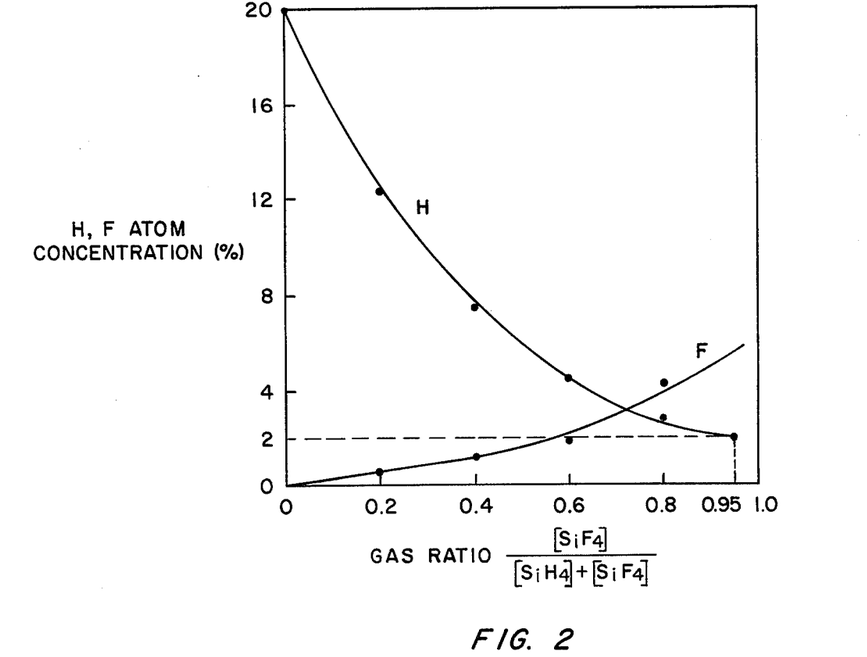

FIGS. 1 to 4 illustrate deposition rates and atomic concentrations of hydrogen and fluorine of an a-Si film, produced by the glow discharge decomposition method. The abscissa represents the partial pressure ratio. FIGS. 1 and 2 concern the case where a mixed gas consisting of SiF$_4$ and SiH$_4$ is employed, and FIGS. 3 and 4 concern the case where a mixed gas consisting of SiF$_4$ and H$_2$ is employed.

With reference to FIGS. 1 and 2, the case where the partial pressure ratio $$\left(\frac{[SiF_4]}{[SiH_4] + [SiF_4]}\right)$$

is zero, indicates that the glow discharge decomposition method employs only the silane gas. Therefore, the atomic concentration of F is 0 and the atomic concentration of H is about 20%. As the partial pressure ratio is increased, the atomic concentration of F is increased, while the atomic concentration of H is decreased. Starting from the partial pressure ratio of about 50%, the deposition rate begins to increase, but at the partial pressure ratio of 90% or higher it decreases abruptly. This is because the amount of H atoms to be bonded with F atoms is reduced extremely, and hence the Si—Si bonds are hardly formed. At the partial pressure ratio of 95% or higher, the film growth cannot be effected at all. The concentration amount of the F atoms becomes the maximum. The concentration amount of H atoms becomes the minimum at the partial pressure ratio just prior to the conditions where the film growth becomes impossible. That content proportion of H atoms is about 2% as seen in FIG. 2.

Figure 3:
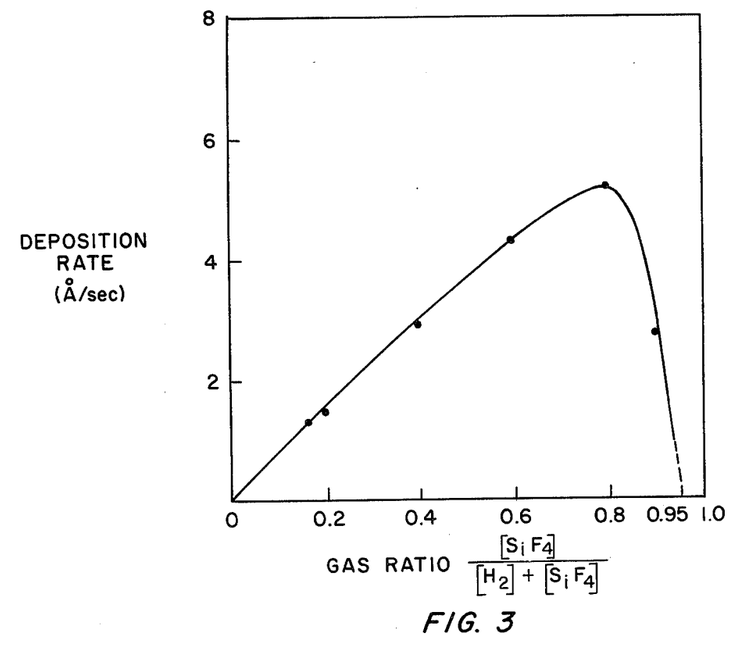
Figure 4:
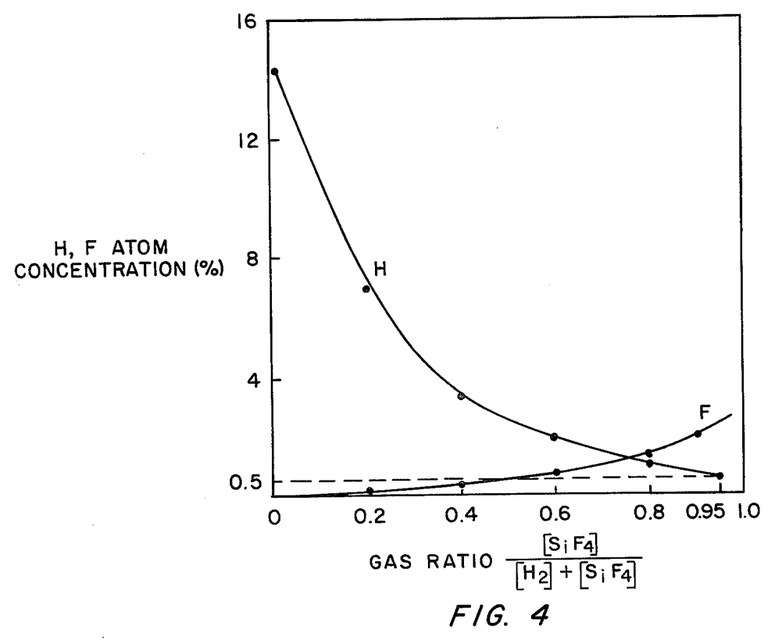

Reference is now made to diagrams illustrated in FIGS. 3 and 4, which concern the case where a hydrogen gas is employed in place of a silane gas. If the partial pressure ratio $$\left(\frac{[SiF_4]}{[H_2] + [SiF_4]}\right)$$

is zero, only a hydrogen gas is employed as an atmosphere gas. For this reason, an a-Si film cannot be grown. As the partial pressure ratio is increased, the deposition rate is increased. The atomic concentration of hydrogen is decreased, while that of fluorine is increased. The deposition rate becomes maximum at the partial pressure ratio of 80%. If the partial pressure ratio exceeds this value, the deposition rate falls abruptly. This is caused by a shortage in the content of a hydrogen gas in the mixed gas, as will be apparent from the preceding explanation. At a partial pressure ratio of 95%, a film will not grow. The atomic concentration of hydrogen at this point is about 0.5%, as can be seen from FIG. 4.

As will be apparent from the above description, in order to deposit the a-Si film containing fluorine, by the glow discharge decomposition method, hydrogen of at least 0.5% in atomic concentration is contained in the film. According to experiments conducted by the inventor, it has been observed that the a-Si film containing hydrogen of 0.5% in atomic concentration showed a deterioration rate of about 10% in photo-conductivity, as compared to an initial value, after the film was irradiated with white light of 200mW for eight hours. Such a rate of deterioration comes within the tolerable range for a film material to be used in civilian instruments, such as solar cells.

However, for a film material to be used in a sensor of a facsimile apparatus, the tolerable range is about 5%. Accordingly, the a-Si film containing hydrogen and fluorine produced by the glow discharge decomposition method is not suitable for devices requiring high reliability. Moreover, although the film containing flourine and hydrogen of 0.5% in atomic concentration has a deterioration rate which might be tolerable in some applications, such a film is not satisfactory in devices requiring a long lifetime.

DETAILED DESCRIPTION OF THE INVENTION

Figure 5:
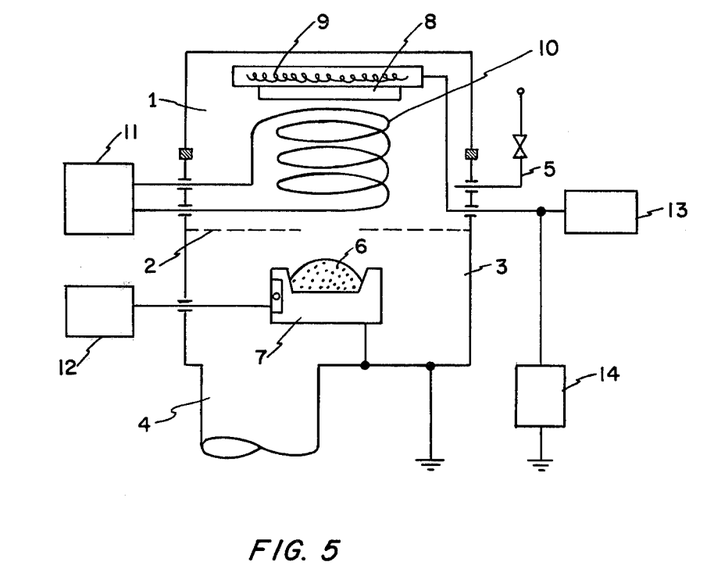
FIG. 5 is a schematic view partly in a block form of an ion-plating apparatus to be used in practicing the method according to the present invention.

An ion-plating apparatus used in the present invention will be explained with reference to FIG. 5. In the illustrated apparatus, a film forming chamber 1 communicates with an electron beam generating chamber 3 via a differential evacuating plate 2. Chamber 1 is connected via an evacuating conductor 4 to a vacuum pump having a high speed evacuation capability, such as an oil diffusion pump (not shown) to maintain chambers 1, 3 at a high vacuum. The film forming chamber 1 is supplied with a minute amount of a silicon tetrafluoride gas. If desired, chamber 1 may also be supplied with a doping gas through a gas introduction pipe 5, the supply being controlled by valve manipulations in a gas system.

The electron beam generating chamber 3 contains an electron-beam-heated source 7 for heating and evaporating an evaporation silicon block 6, which is used as an amorphous silicon film material. In an upper portion of the film forming chamber 1 is disposed a substrate holder 9, for holding a substrate 8, on which a film is to be deposited, heating the substrate and applying an electric potential for accelerating ion to the substrate. Between the electron-beam-heated source 7 and the substrate holder 9 is disposed a radio frequency coil 10 for causing an ionization. A high frequency power supply 11, an electron beam power supply 12, a substrate heating power supply 13 and a DC ion accelerating power supply 14 are provided, externally.

What is important is an ion-plating apparatus having the above-described structure is that it is necessary to maintain the gas pressure within the film forming chamber 1 equal to or higher than $1 \times 10^{-4}$ Torr. This is a requirement for generating a discharge plasma in the film forming chamber 1, without making use of a discharge exciting gas such as, for example, an argon gas. The film forming chamber 1 is supplied with silicon evaporated from the evaporation silicon block 6 in the electron beam generating chamber 3. Chamber 1 is also supplied with the silicon tetrafluoride gas and, if desired, the impurity doping gas, via the gas introduction pipe 5.

It has been discovered through experiments that unless the total pressure of all these gases is maintained equal to or higher than $1 \times 10^{-4}$ Torr, the discharge plasma will not be generated within the film forming chamber 1.

When the discharge plasma is generated, a part of the gas within the film forming chamber 1 is ionized. Ionized atoms are deposited on the substrate 8 owing to the DC ion accelerating power supply 14, and thus a film can be formed. In other words, a growth mechanism of an a-Si film, by the ion-plating method, is similar to the thin film growth mechanism by a physical vapor deposition (PVD) process. Therefore, an a-Si film can be formed without the need for gaseous hydrogen, which is used for removing fluorine.

What is further important in the ion-plating method is the gas pressure within the electron beam generating chamber 3. It has been discovered that if the gas pressure within the electron beam generating chamber 3 is higher than $5 \times 10^{-3}$ Torr, an electron beam is not generated, and hence, silicon is not evaporated from the evaporation silicon block 6. The electron beam generating chamber 3 is coupled to the film forming chamber 1 via a differential evacuating plate 2. Accordingly, the gas pressures between the respective chambers 1 and 3 are closely related to each other. If the differential evacuating plate 2 is sufficiently closed, the gas pressure within the electron beam generating chamber 3 can be maintained sufficiently lower than the pressure within the film forming chamber 1. However, under such a condition, a sufficient evacuation of the film forming chamber 1 cannot be effected and a sufficient supply of the evaporated silicon cannot be delivered to the chamber 1. Therefore, taking into consideration the evacuation of the film forming chamber 1, as well as the supply of the evaporated silicon to the film forming chamber 1, the ratio of gas pressure in the film forming chamber 1 to the gas pressure in the electron beam chamber 3 should be a maximum of about "6".

For the purpose of generating the electron beam, the gas pressure within the electron beam generating chamber 3 must be equal to or lower than $5 \times 10^{-3}$ Torr, as mentioned above. As a result, the gas pressure within the film forming chamber 1 must be between $1 \times 10^{-4}$ to $3 \times 10^{-2}$ Torr in order to form the a-Si film without employing an argon gas.

The silicon tetrafluoride gas is introduced through the gas introduction pipe 5 into the chamber 1. Considering such gas pressure conditions, the a-Si film contains fluorine and does not contain hydrogen nor argon. It will be understood by making reference to the ion-plating apparatus shown in FIG. 5 that the atomic concentration of fluorine in the deposited a-Si film is closely related to the partial pressure of the silicon tetrafluoride gas. For example, if the partial pressure of the silicon tetrafluoride gas is small, then the atomic concentration of fluorine is low. If the concentration of silicon tetrafluoride gas is large, then the fluorine concentration is high. However, it is to be noted that if the atomic concentration of fluorine in the film is too low, the dangling bonds in the a-Si film are not compensated sufficiently by the fluorine atoms. Furthermore, it is also to be noted that the silicon tetrafluoride gas has an etching effect. This means that if the partial pressure of the silicon tetrafluoride gas is too high, the etching rate by the silicon tetrafluoride gas is higher than the film deposition rate, and the film cannot be formed.

Thus, the gas flow rate ratio, that is, the partial pressure ratio of the gases supplied into the film forming chamber 1 must be determined by taking into consideration the above-referred three conditions. That is, the gas pressure range required for forming a film, the atomic concentration of fluorine in an a-Si film required to compensate for the dangling bonds, and the deposition rate of silicon that is large enough to overcome the etching effect of silicon tetrafluoride must be considered. It should be noted that the gas flow rate ratio and the gas partial pressure rate are proportional to each other. The impurity doping gas controls a conductivity type and an electric conductivity of the a-Si film. The doping gas has a negligibly small flow rate as compared to the flow rate of an evaporated silicon gas and a silicon tetrafluoride gas.

On the other hand, the partial pressure of the silicon tetrafluoride gas and the partial pressure of the evaporated silicon gas are intimately related to each other according to the above-referred three conditions. For example, even if the partial pressure of the silicon tetrafluoride gas is relatively high, so long as the partial pressure of the evaporated silicon gas is sufficiently high, the deposition rate would be larger than the etching rate, so that theoretically a film could be formed. However, when the total gas pressure of the silicon tetrafluoride gas and the evaporated silicon gas in the film forming chamber 1 is higher than $3 \times 10^{-2}$ Torr, an electron beam would not be generated, and a sufficient amount of silicon cannot evaporate. Even if a sufficient amount of silicon tetrafluoride gas is introduced into the film forming chamber 1 in order to form an a-Si film containing fluorine in a necessary atomic concentration, the a-Si film containing fluorine cannot be formed when the evaporation rate of silicon is small so that the total gas pressure becomes lower than $1 \times 10^{-4}$ Torr. This is because the discharge plasma is not generated.

As described above, in order to produce an a-Si film containing fluorine and having predetermined electrical properties by an ion-plating process, it is most important to select a partial pressure ratio of the silicon tetrafluoride gas. That is, the ratio of the partial pressure of introduced silicon tetrafluoride gas to the sum of the partial pressure of evaporated silicon gas and the partial pressure of the introduced silicon tetrafluoride gas is the most important factor. The inventor has discovered an optimum range of the partial pressure ratio of the silicon tetrafluoride gas through a great many experiments. In the following specification, a description will be made of these optimum conditions.

An evaporation rate of silicon is governed by electron beam energy, that is, by an electron beam current. The partial pressure of the silicon tetrafluoride gas is governed by the introduction rate of a silicon tetrafluoride gas, through the gas introduction pipe 5.

Figure 6:
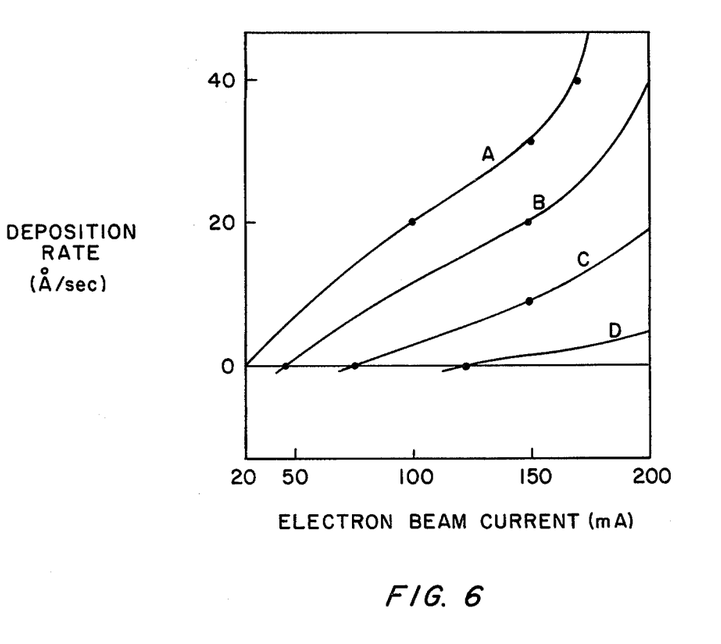
FIG. 6 is a diagram showing the relationships of a film deposition rate to an electron beam current, taking a partial pressure of a silicon tetrafluoride gas as a parameter.

FIG. 6 shows the relationship between the electron beam current and the deposition rate of the film taking the partial gas pressure of the introduced silicon tetrafluoride gas as a parameter. Curves A, B, C and D represent the relationship in the cases of the partial pressure of the silicon tetrafluoride gas of $5 \times 10^{-5}$ Torr, $2 \times 10^4$ Torr, $5 \times 10^{-3}$ Torr and $1 \times 10^{-2}$ Torr, respectively. As will be seen from this figure, the minimum electron beam current which can deposit the a-Si film is varied depending upon the partial pressure of the introduced silicon tetrafluoride gas. This is because silicon tetrafluoride gas has an etching effect as described above. Hence, as the partial pressure of the silicon tetrafluoride gas is increased, a larger evaporation rate of silicon is required to compensate for an increased etching effect. Among these quantities a proportional relationship exists. Therefore, the partial pressure ratio of the silicon tetrafluoride gas necessary for depositing an a-Si film is held constant.

Figure 7:
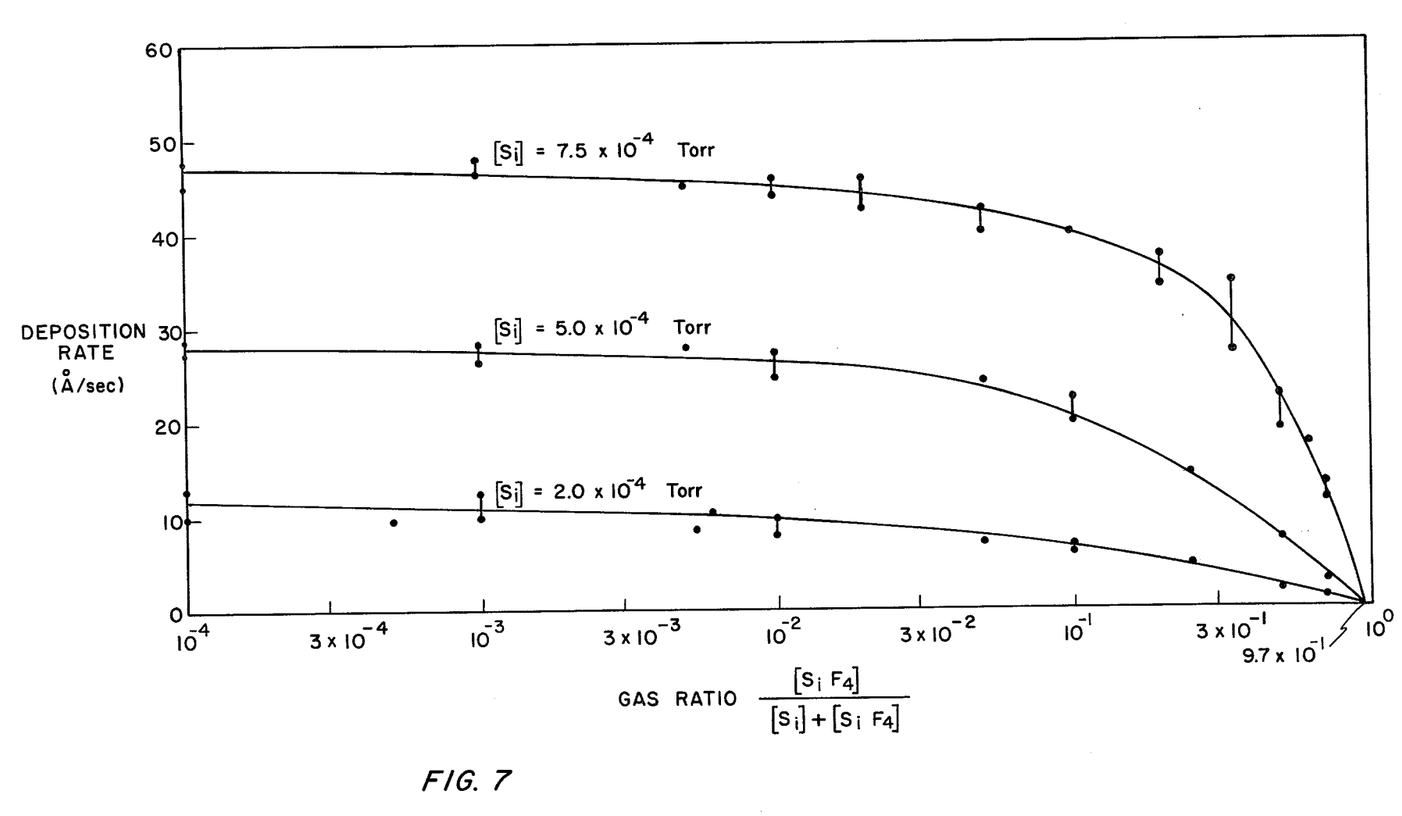

FIG. 7 shows a deposition rate as a function of the partial pressure ratio of the silicon tetrafluoride gas $$\left( \frac{[SiF_4]}{[Si] + [SiF_4]} \right)$$

taking the partial pressure of evaporated silicon gas as a parameter. From this figure, it is seen that for a given partial pressure ratio, the deposition rate is lowered as the partial pressure of evaporated silicon is reduced. This is because, for the given pressure ratio, the partial pressure of the introduced silicon tetrafluoride gas which generates a discharge plasma is decreased as the pressure of the evaporated silicon is decreased.

The results of experiments illustrated in FIG. 7 indicate an important matter that an a-Si film cannot be formed if the partial pressure ratio of silicon tetrafluoride exceeds $9.7 \times 10^{-1}$. This is because the etching rate of silicon tetrafluoride becomes larger than the deposition rate of silicon. Accordingly, in order to form an a-Si film, the partial pressure ratio of silicon tetrafluoride must be equal to or less than $9.7 \times 10^{-1}$. Even if the partial pressure ratio is zero, that is, even if the partial pressure of the silicon tetrafluoride gas is zero, the a-Si film can be formed as long as the electron beam is generated to evaporate silicon and the discharge plasma is generated. However, the a-Si film formed under such an extreme condition would not contain fluorine to compensate for the dangling bonds.

Figure 8:
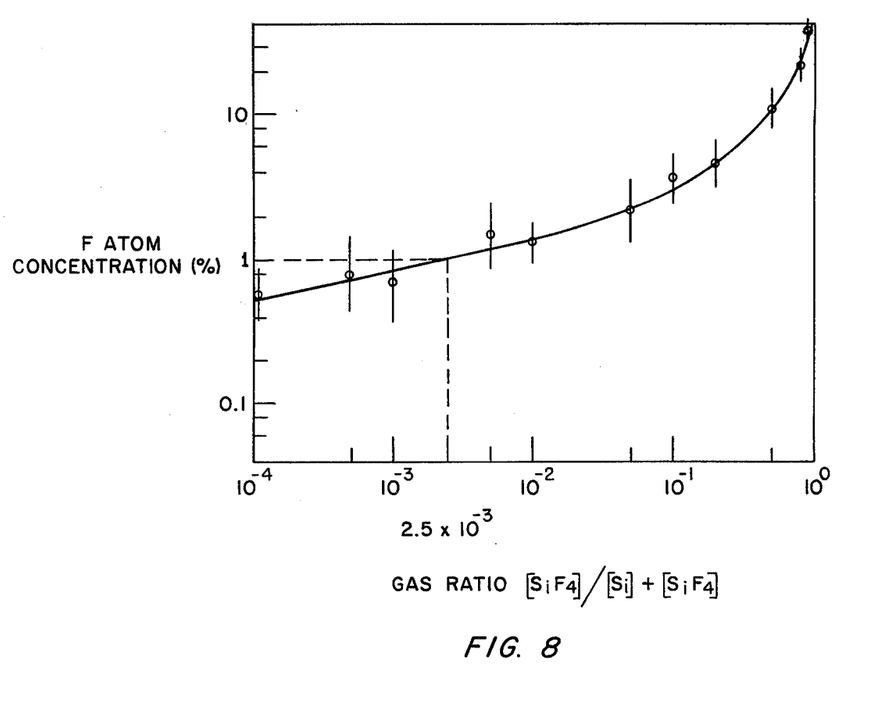
FIG. 8 is a diagram showing an atomic concentration of fluorine (F) contained in a film deposited by the method according to the present invention as a function of the partial pressure ratio $$\left(\frac{[SiF_4]}{[Si]+[SiF_4]}\right)$$

FIG. 8 shows an atomic concentration of fluorine in the a-Si film as a function of the partial pressure ratio of silicon tetrafluoride. It has been generally known that an atomic concentration of H or F atoms of about 1% is necessary to compensate for dangling bonds in the a-Si film. The inventor has also confirmed through experiments that the atomic concentration value is 1%. From examining FIG. 8, it can be understood that a partial pressure ratio of $2.5 \times 10^{-3}$ or larger is necessary for attaining an atomic concentration of fluorine of at least about 1%.

Combining the above-mentioned conclusions, it is possible to determine the best partial pressure ratio range in order to obtain the necessary atomic concentration of fluorine in an a-Si film for compensating dangling bonds and to readily deposit an a-Si film. The partial pressure ratio of silicon tetrafluoride $$\left( \frac{[SiF_4]}{[Si] + [SiF_4]} \right)$$

must be selected in the range of $2.5 \times 10^{-3}$ to $9.7 \times 10^{-1}$. If the partial pressure ratio of silicon tetrafluoride is chosen to fall in this pressure ratio range, then at least the dangling bonds can be compensated and an a-Si film can be readily formed. However, there still remains a problem of whether the readily formed a-Si film can provide the desired electrical properties, especially a desired photo-conductivity.

Figure 9:
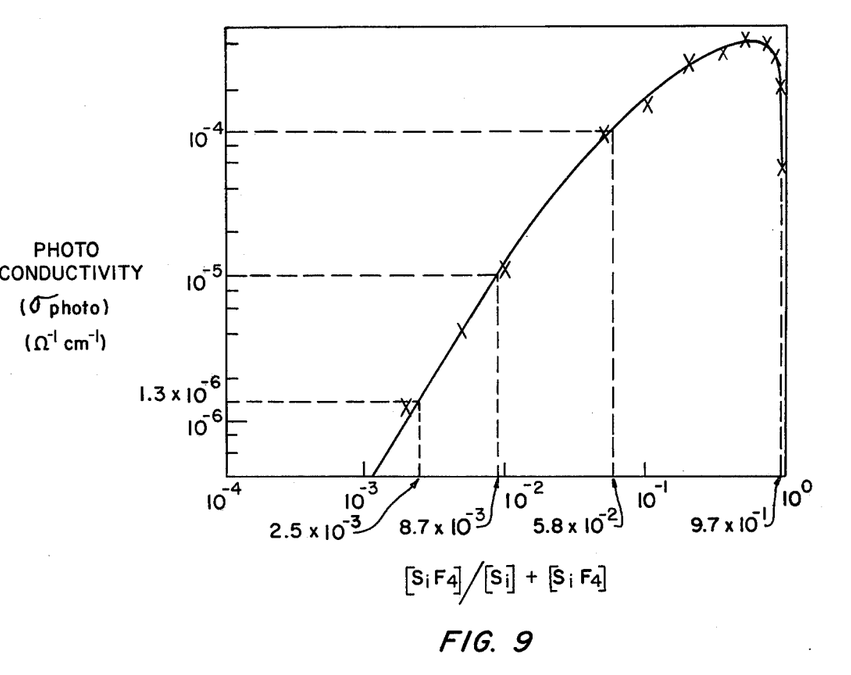
FIG. 9 is a diagram showing a photo-conductivity of the deposited film according to the present invention as a function of the partial pressure ratio $$\left(\frac{[SiF_4]}{[Si]+[SiF_4]}\right);$$

FIG. 9 is a characteristic diagram which graphically indicates this problem, in which the partial pressure ratio is taken along the abscissa and a photo-conductivity is taken along the ordinate. From this figure, it is seen that the photo-conductivity attained with the partial pressure ratio of $2.5 \times 10^{-3}$ is $1.3 \times 10^{-6} \Omega^{-1} \cdot cm^{-1}$. A photo-conductivity of an a-Si film having dangling bonds compensated by hydrogen, which has been prepared in trial and put in practical use, is about $1 \times 10^{-5} \Omega^{-1} cm^{-1}$.

Accordingly, the a-Si film prepared under the above-mentioned partial pressure ratio condition is inferior to the film containing hydrogen which are prepared by the glow discharge decomposition method in an electrical property of the photo-conductivity. However, the film prepared under that condition is superior to that produced by the prior art method in reliability such as a thermal stability, an optical stability, etc. Therefore, for the purpose of attaining an a-Si film having a high reliability as well as excellent electrical properties, it is necessary to select the partial pressure ratio of silicon tetrafluoride $$\left( \frac{[SiF_4]}{[Si] + [SiF_4]} \right)$$

in the range of $8.7 \times 10^{-3}$ to $9.7 \times 10^{-1}$.

For an image sensor in a facsimile apparatus, an a-Si film having higher reliability and a photo-conductivity of about $1 \times 10^4 \Omega^{-1} \cdot cm^{-1}$ is required. To meet this requirement, it is desirable to select the partial pressure ratio in the range of $5.8 \times 10^{-2}$ to $9.7 \times 10^{-1}$, as seen from FIG. 9. Here, it is to be noted that the above-stated range is concluded to be acceptable despite of the fact that a photo-conductivity becomes smaller than $1 \times 10^{-4} \Omega^{-1} \cdot cm^{-1}$ at a partial pressure ratio exceeding $9.3 \times 10^{-1}$. The reason for such a conclusion will be readily understood from the following description of the reason why a photo-conductivity is lowered at a partial pressure ratio of silicon tetrafluoride exceeding $7 \times 10^{-1}$.

As the partial pressure ratio is increased, that is, as the rate of introduction of the silicon tetrafluoride gas is increased, the silicon tetrafluoride gas within the film forming chamber 1 would become difficult as decomposed perfectly. For this reason, fluorine (F) taken into the a-Si film would form higher order bonds such as $Si-F_2$, $Si-F_3$ and $Si-F_4$ beside the $Si-F$ bonds. Therefore, although the dangling bonds can be compensated by fluorine (F), a density of localized states is increased due to the higher order bonds. As a result, a photo-conductivity is lowered. However, the inventor has discovered that if the acceleration voltage supplied by the ion accelerating power supply 14 (FIG. 5) is increased, these higher order bonds can be suppressed and photo-conductivity can be increased.

Figure 10:
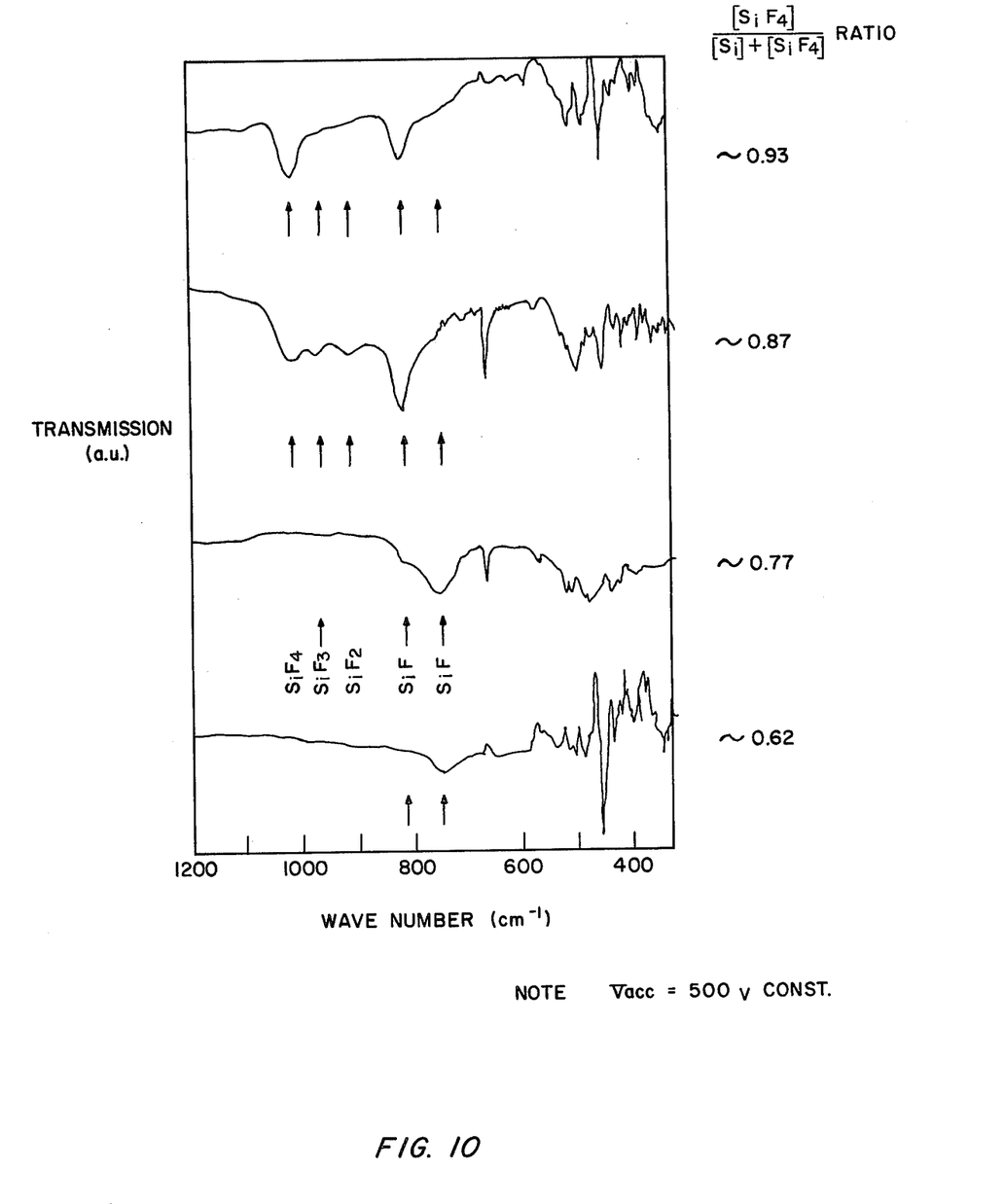

With reference to FIG. 10, which shows an infrared transmission of an a-Si film as a function of a wave number taking the partial pressure ratio of silicon tetrafluoride as a parameter, it will be understood that higher order bonds of $Si-F_2$, $Si-F_3$ and $Si-F_4$ are present for partial pressure ratio of 0.87. The ion accelerating voltage $V_{acc}$ employed in the experiments illustrated in FIG. 10 is 500 V.

Figure 11:
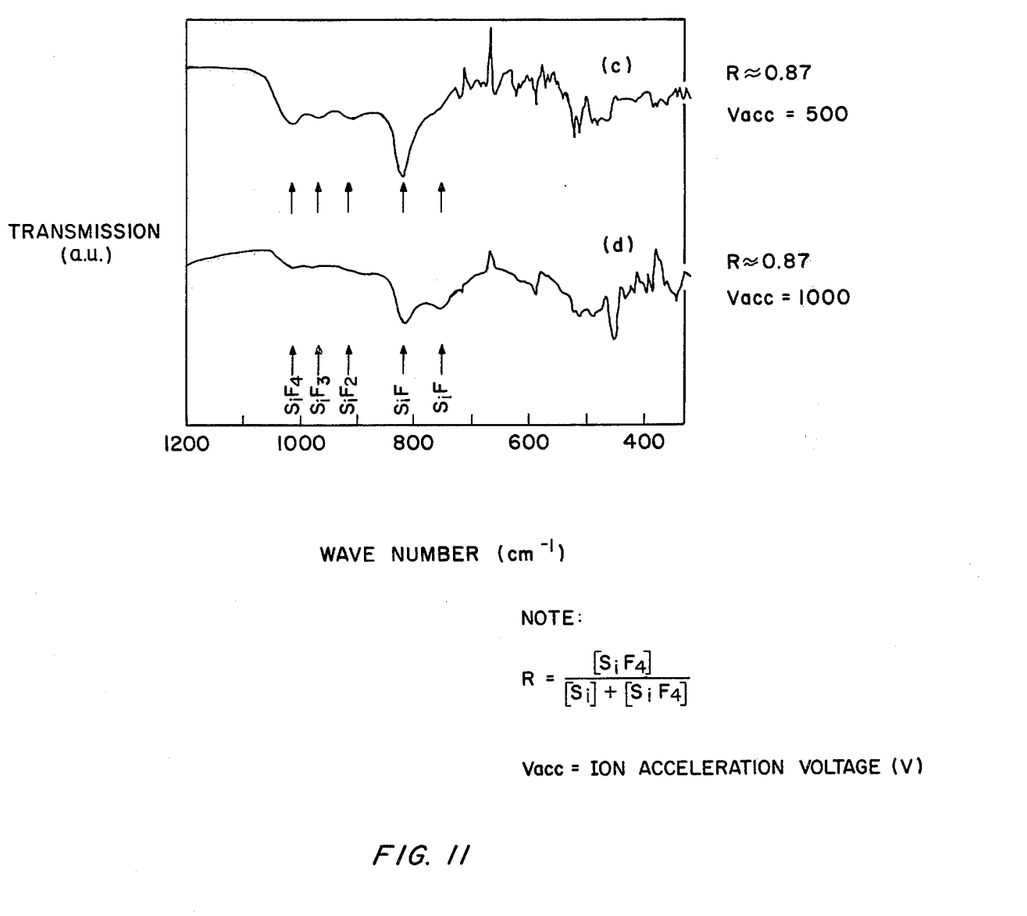

On the other hand, with reference to FIG. 11, it will be seen that if the ion accelerating voltage $V_{acc}$ is raised from 500 V to 1000 V while maintaining the partial pressure ratio of 0.87, then the higher order bonds are suppressed. Likewise, at the partial pressure ratio of 0.97, a suppression of the higher order bonds is obtainable. Therefore, the decrease of a photo-conductivity at the high values of the partial pressure ratio, as indicated in FIG. 9, can be compensated by increasing the ion accelerating voltage $V_{acc}$. It should be noted that the improvement in the photo-conductivity by the increase of the ion accelerating voltage $V_{acc}$ is effective at the higher partial pressure ratio. This is because, at a low pressure ratio, higher order bonds are hardly formed.

From the above-mentioned disclosure, to produce an a-Si film having high reliability, the partial pressure ratio of silicon tetrafluoride could be selected in the range of $2.5 \times 10^{-3}$ to $9.7 \times 10^{-1}$. For the purpose of also improving its electrical properties jointly with its reliablity, the partial pressure ratio should be selected in the range of $8.5 \times 10^{-3}$ to $9.7 \times 10^{-1}$. In order to obtain high reliablity as well as the high photo-conductive property, the partial pressure ratio will be selected in the range of $5.8 \times 10^{-2}$ to $9.7 \times 10^{-1}$.

As described above, according to the present invention, an a-Si film having a low density of a localized state can be formed for compensating dangling bonds by bonding silicon to fluorine. Moreover, owing to the strong bonding between silicon and fluorine atoms, the film has a high reliability which does not deteriorate even under the influence of a high temperature of about 600° C., intense light or a strong electric field. Furthermore, an improvement in photo-conductivity can be also realized. In addition, the process according to the present invention may be practiced while mixing a fluoride impurity into the silicon tetrafluoride gas, as an impurity doping agent. As a result, an a-Si film can be formed containing fluorine and not contain hydrogen and argon and having various conductivity types and electric conductivities due to the doped impurity. Furthermore, by ionizing the impurity atoms, a doping effect can be widely improved.

In addition, it has been discovered that, if a small amount of hydride is mixed into a reaction gas comprising the silicon tetrafluroide gas, the surface smoothness of the a-Si film is improved. However, if too much hydrogen or a hydride is mixed the reliability, such as a thermal resistance of the produced film, is degraded.

The present invention has a basic difference from the heretofore known method such as the glow discharge method in that mixing of hydrogen into the reaction gas may be optional. Hydrogen is not used to compensate for dangling bonds, but is used for making the surface smoother. According to the present invention, an a-Si film containing fluorine can be produced without the need for hydrogen, as distinguished from the glow discharge decomposition method which does require hydrogen. In the known glow discharge decomposition method, hydrogen is indispensable. Therefore, hydrogen is contained in the produced a-Si film at a minimum atomic concentration of 0.5%.

According to the present invention, since hydrogen is not essential, the introduction rate of the hydrogen gas or the hydride gas is determined by taking into consideration the desired surface smoothness and the reliability of the produced film. Consequently, the atomic concentration of hydrogen in the produced a-Si film can be achieved at arbitrary levels which are below 0.5%.

Table 1 indicates a relationship between a flow rate ratio of the hydrogen gas to the silicon tetrafluoride gas and an atomic concentration ratio of hydrogen in the a-Si film. Table 1 also shows a deterioration rate, with respect to its initial value, of a photo-conductivity when a prepared a-Si film is irradiated with white light of 200 mW for eight hours.

TABLE 1

| FLOW RATE RATIO OF HYDROGEN GAS | ATOMIC CONCENTRATION OF HYDROGEN IN FILM (%) | DETERIORATION RATE |
| --- | --- | --- |
| 1.0 | 14.0 | 0.80 |
| 0.7 | 8.0 | 0.65 |
| 0.4 | 2.0 | 0.35 |
| 0.13 | 0.5 | 0.10 |
| 0.07 | 0.03 | 0.05 |
| 0.01 | 0.001 | 0.01 |

As will be seen from Table 1, when the flow rate ratio of the hydrogen gas is 0.13, the atomic concentration of hydrogen in the produced a-Si film amounts to 0.5%. This value is equivalent to the atomic concentration of hydrogen when a glow discharge decomposition process is employed. The deterioration rate for this atomic concentration of hydrogen is 0.10 (10%). This value falls in a tolerable range for solar cells or the like. However, it is not suitable for instruments requiring high reliablity, such as an image sensor in a facsimile apparatus or the like. Such instruments requiring high reliablity have a tolerable limit with a deterioration rate of about 5%. An atomic concentration of hydrogen corresponding to this deterioration rate is 0.03%, as learned from Table 1. According to the glow discharge decomposition method, such a low atomic concentration of hydrogen cannot be realized. However, according to the present invention, since hydrogen is introduced, not for compensating dangling bonds or removing fluorine, but for improving the surface smoothness of the a-Si film, an atomic concentration of 0.03% or 0.001% as appearing in Table 1 can be achieved.

As described above, it is concluded from Table 1 that the flow rate ratio of the hydrogen gas to be introduced should be in the range of 0.01 to 0.13 for retaining a certain degree of reliablity and improving surface smoothness of a prepared a-Si film. In order to realize higher reliability, a flow rate ratio of hydrogen could be in the range of 0.01 to 0.07. It is to be noted that an a-Si film with a practical surface can be obtained even without introducing hydrogen. In other words, it is not true that it is impossible for a-Si film containing no hydrogen to be used in practice. However, if importance is put on reliablity, it is preferred that the film contain no hydrogen at all.

In the following, more detailed Examples of the embodiment of the method according to the present invention will be explained:

EXAMPLE 1

A glass substrate of 700 μm thickness is subjected to a supersonic wave, washing with trichloroethylene, and thereafter, it is dried. This glass substrate is set as the substrate 8 on the substrate holder 9 in an ion-plating apparatus shown in FIG. 5. Evacuation of the apparatus is effected until a vacuum pressure of $10^{-6}$ Torr or less is attained. Subsequently, a silicon tetrafluoride gas is introduced through the gas introduction pipe 5 until the vacuum pressure within the film forming chamber 1 becomes $2 \times 10^{-4}$ Torr. The vacuum pressure within the electron beam generating chamber 3 becomes about $10^{-5}$ Torr owing to the action of the differential evacuating plate 2 so that operations for generating an electron beam in the chamber 3 are possible.

Then, the substrate 8 is heated and held at 300° C. by means of the heating power supply 13. An n-type silicon block 6 having a specific resistance of 30 Ω-cm is charged in the electron-beam-heated evaporation source 7 as the silicon material for evaporation. It is then evaporated by electron-beam heating, energized by the electron beam power supply 12. At this moment, the high frequency coil 10 is connected to the high frequency power supply 11 of 13.56 MHz. By the electric power from the power supply 11, the discharge plasma is generated. The discharge plasma ionizes the evaporated silicon atoms and decomposes the silicon tetrafluoride gas. An ion accelerating voltage of several tens to several hundreds volts is applied to substrate holder 9 by the power supply 14 to precisely control the transport amount and velocity of the produced ions. When the evaporation source 7 is heated by means of an electron beam current of 140 mA, a deposition rate of 20 Å/sec is attained. Under the above-described operating conditions, an amorphous silicon film of 1.0 μm thickness has been formed in about eight minutes.

Figure 12:
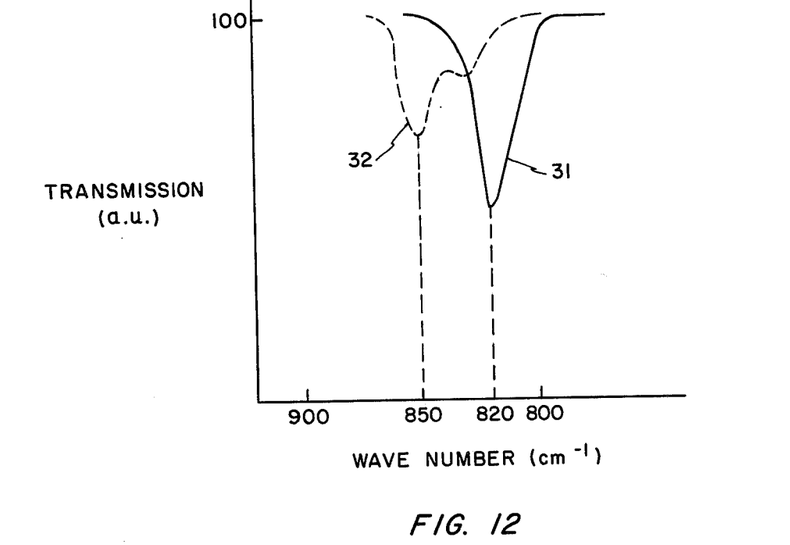
FIG. 12 is a diagram showing an infrared transmission characteristic as a function of a wave number, for an a-Si film containing hydrogen and an a-Si film containing fluorine.

Measuring an infrared transmission spectrum of the formed amorphous silicon film, produces the results represented by a solid line 31 in FIG. 12. The absorption peak exists at the wave number of 820 cm$^{-1}$. Thus, the generation of Si—F bonds has been confirmed. There is no absorption peak at the wave number of 850 cm$^{-1}$ such as shown in a dash line 32 which represents the characteristics of the a-Si film containing hydrogen. That is to say, the Si—H bond is not generated. After aluminum electrodes have been formed on the prepared amorphous silicon film, a photo-conductivity is measured by irradiating the film with a light. The measured photo-conductivity is $5 \times 10^{-5}$ Ω$^{-1}$·cm$^{-1}$.

Figure 13:
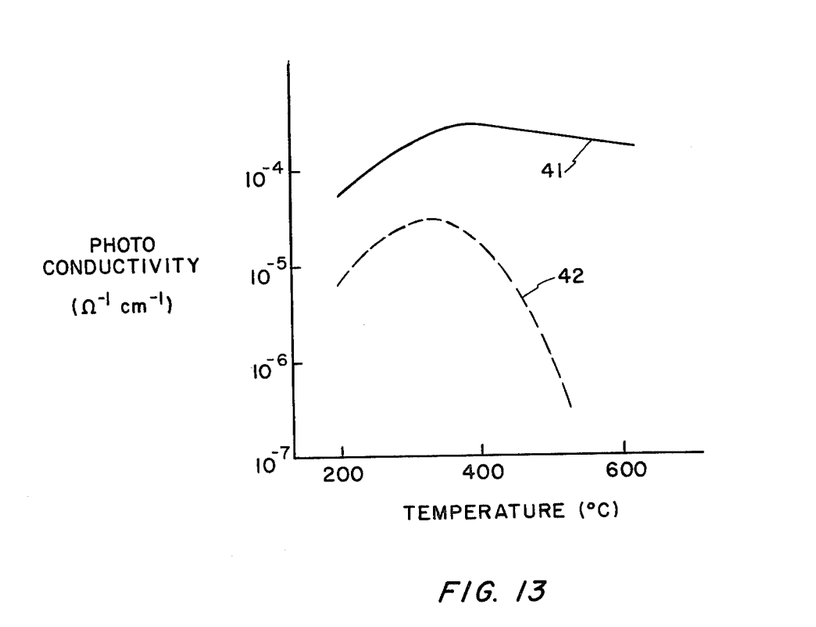
FIG. 13 is a diagram showing a variation of a photoconductivity as a function of a heat treatment temperature, for an a-Si film containing hydrogen and an a-Si film containing fluorine.

A result of similar measurements of the photo-conductivity conducted after heat treatment is shown by a solid line 41 in FIG. 13. Since the amorphous silicon film formed by the method according to the present invention contains about 0.5% fluorine therein, no remarkable deterioration of the photo-conductivity had been observed, despite the heat treatment at the high temperature of about 600° C. This is in contrast to the remarkable deterioration of the photo-conductivity of an amorphous silicon film containing hydrogen as represented by a dash line 42 in FIG. 13. The a-Si film according to the present invention is thermally very stable. In addition, it has been discovered that an amorphous silicon film having high photo-conductivity can be obtained. The high photo-conductivity may be possibly attributed to the relatively small density of localized states.

EXAMPLE 2

A stainless steel plate, having its surface polished to a mirror-face, has been used as a substrate. The film forming conditions is almost equal to that of Example 1. The difference is that instead of the silicon tetrafluoride gas, the film forming chamber 1 is supplied with a silicon tetrafluoride gas containing a boron trifluoride gas of 1%. The gases are supplied through the gas introduction pipe 5 (FIG. 5) at a flow rate of 4 cc/min. Then, an amorphous silicon film is deposited on the stainless steel substrate. In this instance, the amorphous silicon film of p+ type conductivity was obtained. When a silicon tetrafluoride gas containing 0.5% boron trifluoride gas has been introduced at a flow rate of 1 cc/min, an amorphous silicon film of P type conductivity is deposited. In addition, when a silicon tetrafluoride gas containing 0.5% phosphorous pentafluoride gas is introduced at the rate of 1 cc/min, an amorphous silicon film of n+ type conductivity has been obtained.

In either of these operating conditions, the formed amorphous silicon film has fewer structural defects and a small density of localized states. Dangling bonds are compensated by fluorine and the film surface is not exposed to high energy plasma because ion-plating is effected within a high vacuum. In addition, in the ion-plating method, a quantity of boron or phosphorous is also ionized. Therefore, the introduction of boron or phosphorous into the amorphous silicon film is achieved and a high proportion of ionization of the introduced boron or phosphorous atoms in the film serves as impurity carriers. An excellent value of doping efficiency can be obtained. Moreover, by switching the doping gas, either an n-type or p-type amorphous silicon film can be prepared, and by combining with the non-doped amorphous silicon film obtained in Example 1, amorphous silicon films having various structures can be obtained.

EXAMPLE 3

A commercially available glass plate having an indium-tin oxide film deposited on its surface has been used as a substrate. Then, an amorphous silicon film is deposited on the substrate through the same procedure as Example 1. However, with regard to the species of gases introduced through the gas introduction pipe, the mixed gases used in Example 2 have been used by switching over in the midway of the deposition. At first, an amorphous silicon film of p+ type conductivity has been deposited at 200 Å thickness by employing the silicon tetrafluoride gas mixed with the boron trifluoride gas. Subsequently, the introduced gas is switched to the silicon tetrafluoride gas, by a valve manipulation. Then, an non-doped amorphous silicon film has been deposited at 5000 Å thickness. Further, the introduced gas is switched to the silicon tetrafluroide gas mixed with the phosphorous pentafluoride gas, again by a valve manipulation, in a similar manner to the first switching. Then, an amorphous silicon film of n+ conductivity type was deposited at 400 Å thickness. Thus, an amorphous silicon film having p+in+ structures are formed by value manipulation. The Si—F bonds are formed in every amorphous silicon layer, neither hydrogen nor argon is present in the amorphous silicon layers.

Measurements have been made of characteristics of an amorphous silicon solar cell which was produced by employing the produced amorphous silicon and by vapor depositing an ohmic contact metal to the film, through a conventional process, to form electrodes. Solar cells having a photo-electric conversion efficiency of 4% or higher have been obtained with good reproducibility. Further improvements in the characteristics of such solar cells are expected by investigating the conditions for forming an amorphous silicon film. In addition, it will be self-explanatory that the present invention is equally applicable to a solar cell structure other than the above-described p+in+ structure.

EXAMPLE 4

A silicon wafer is used as a substrate. An amorphous silicon film was deposited on the substrate through the same procedure as Example 1. However, as the gases introduced through the gas introduction pipe 5 (FIG. 5), gases are prepared by additionally mixing a silane-mixed hydrogen gas into the gases used in Examples 1 and 3, at a rate of 0.07% to the total flow rate. Then, an amorphous silicon film having a thickness of 3 μm is deposited. Thereafter, the unevenness of the film surface is observed. As a result, it has been confirmed that, in the case of not mixing the silane-mixed hydrogen gas, the roughness of the film surface has been found under observation by an electron microscope at a magnification of 10,000. Thus, the film has a poor flatness and smoothness. However, if the silane-mixed hydrogen gas was mixed, the roughness has not been found on the film surface, even under similar observation at a magnification of 50,000. Thus, a film having an excellent flatness and smoothness could be formed.

However, it has been confirmed, as a result of similar observation, that if the mixing ratio of the silane-mixed hydrogen gas to the total flow rate is 0.01 or less, the effect of flattening and smoothening a surface is poor. In addition, it has been discovered that in the case of a mixing ratio of 0.13 or higher, in a long period test at a temperature of 400° C. or higher, the deterioration of characteristics is found and there is a deterioration of thermal resistance.

Especially, in the case where the mixing ratio is raised to "1" or higher, it has been discovered that new voids (vacant holes) are liable to be generated and the surface smoothness deteriorates on the prepared amorphous silicon film. Moreover, a phosphine-mixed hydrogen gas, a diborane-mixed hydrogen gas, a phosphine-mixed silicon tetrafluoride gas or a diborane-mixed tetrafluoride gas (which are well known as an impurity doping agent) may be employed instead of the silane-mixed hydrogen gas. Such a mixed gas can achieve both the effect of a surface nature control agent and the effect of an impurity doping agent. Although the effect of flattening and smoothening a film surface is inferior to that obtained by mixing a silane-mixed hydrogen gas, an effect of flattening and smoothening a film surface is recognized due to a mixing of hydrogen into the introduced gas. Furthermore, a similar effect is also attained by mixing a minute amount of another hydride or hydrogen.

As described above, according to the present invention, a silicon tetrafluroide gas or a mixed gas consisting of a silicon tetrafluoride and a boron trifluoride or phosphorous pentafluoride gas can be employed instead of a silane (SiH$_4$) gas to form an amorphous silicon film by making use of an ion-plating process. It is possible to make the deposited amorphous silicon film containing either no or very little hydrogen, contain fluorine having a large bonding energy in the bond with silicon, and not contain any argon which would introduce defects. Accordingly, an amorphous silicon film can be provided with an excellent thermal resistance. A film material having excellent device characteristics is achieved since the density of localized states can be reduced and a doping efficiency improved.

The present invention is also applied to an amorphous germanium film. In this case, a germanium block is disposed in the electron beam evaporation source 7 (FIG. 5), and a fluoride gas of germanium is introduced into the film forming chamber 1 through the pipe 5. Then, an amorphous germanium film containing fluorine is deposited.

What is claimed is:

1. A method for preparing a semiconductor film by utilizing an ion-plating method, comprising the steps of disposing a substrate within a reaction chamber, providing a semiconductor material, applying an ion accelerating voltage between said substrate and said semiconductor material, evaporating said semiconductor material to supply an evaporated semiconductor gas into said reaction chamber, introducing a fluoride gas of semiconductor material into said reaction chamber, generating a high frequency electric field within said reaction chamber, and controlling a gas pressure within said reaction chamber so that said high frequency electric field causes ionization of said evaporated semiconductor gas but precludes a sputtering of said semiconductor material, whereby said evaporated semiconductor gas is ionized within said reaction chamber and an amorphous semiconductor film containing fluorine is deposited on said substrate.

2. A method for preparing a semiconductor film as claimed in claim 1, wherein said gas pressure within said reaction chamber is controlled within a pressure range of $1 \times 10^{-4}$ to $3 \times 10^{-2}$ Torr.

3. A method for preparing a semiconductor film as claimed in claim 2, wherein said semiconductor material is silicon and said fluoride of the semiconductor material is silicon tetrafluoride.

4. A method for preparing a semiconductor film as claimed in claim 2, further comprising the step of introducing an impurity doping gas into said reaction chamber.

5. A method of producing an amorphous silicon film on a substrate by making use of an ion-plating apparatus having a film forming chamber and a silicon evaporating chamber separated from each other, comprising the steps of disposing said substrate within said film forming chamber, applying a potential to said substrate, providing silicon in said silicon evaporating chamber, evaporating said silicon in said silicon evaporating chamber to form silicon gas, supplying said silicon gas from said silicon evaporating chamber into said film forming chamber, introducing silicon tetrafloride gas into said film forming chamber, generating a high frequency electric field within said film forming chamber, and adjusting a gas pressure within said film forming chamber such that said silicon gas supplied into said film forming chamber is ionized when said high frequency electric field is generated in said film forming chamber, whereby said silicon gas within said film forming chamber is ionized and at the same time said silicon tetrafluoride gas is decomposed by said high frequency electric field within said film forming chamber to deposit an amorphous silicon film containing fluorine on said substrate.

6. A method for producing an amorphous silicon film as claimed in claim 5, wherein said gas pressure within said film forming chamber is adjusted in the range of $1 \times 10^{-4}$ to $3 \times 10^{-2}$ Torr.

7. A method for producing an amorphous silicon film as claimed in claim 6, wherein a pressure ratio of a partial pressure of said silicon tetrafluoride gas introduced into said film forming chamber to said gas pressure within said film forming chamber is in a range of $2.5 \times 10^{-3}$ to $9.7 \times 10^{-1}$.

8. A method for producing an amorphous silicon film as claimed in claim 6 wherein a pressure ratio of a partial pressure of said silicon tetrafluoride gas introduced into said film forming chamber to said gas pressure within said film forming chamber is in a range of $8.7 \times 10^{-3}$ to $9.7 \times 10^{-1}$.

9. A method for producing an amorphous silicon film as claimed in claim 6, wherein a pressure ratio of a partial pressure of said silicon tetrafluoride gas introduced into said film forming chamber to said gas pressure within said film forming chamber is in a range of $5.8 \times 10^{-2}$ to $9.7 \times 10^{-1}$.

10. A method for producing an amorphous silicon film as claimed in claim 6, further comprising the step of introducing an impurity doping gas into said film forming chamber.

11. A method for producing an amorphous silicon film as claimed in claim 10, wherein said impurity doping gas is boron trifluoride gas and said doping gas is introduced into said film forming chamber with said silicon tetrafluoride gas.

12. A method for producing an amorphous silicon film as claimed in claim 6, further comprising the step of introducing hydrogen into said film forming chamber.

13. A method for producing an amorphous silicon film as claimed in claim 12, wherein said hydrogen is used as a film surface control agent for the film deposited on said substrate, and is mixed with said silicon tetrafluoride gas at a flow rate ratio of 0.01 to 0.13 to the flow rate of said silicon tetrafluoride gas.

14. A method for producing an amorphous silicon film as claimed in claim 12, wherein said hydrogen is mixed with said silicon tetrafluoride gas at a flow rate ratio of 0.01 to 0.07 to the flow rate of said silicon tetrafluoride gas.

15. A method for producing an amorphous silicon film as claimed in claim 10, wherein said impurity doping gas is phosphorous pentafluoride, and said doping gas is introduced into said film forming chamber with said silicon tetrafluoride gas.

16. The method for producing an amorphous silicon film as claimed in claim 6, further comprising the step of introducing hydride into said film forming chamber.

17. The method for producing an amorphous silicon film as claimed in claim 16, wherein said hydride is used as a film surface control agent for the film deposited on said substrate, and said hydride is mixed with said silicon tetrafluoride gas at a flow rate ratio of 0.01 to 0.13 to the flow rate of said silicon tetrafluoride gas.

18. The method for producing an amorphous silicon film as claimed in claim 16, wherein said hydride is mixed with said silicon tetrafluoride gas at a flow rate ratio of 0.01 to 0.07 to the flow rate of said silicon tetrafluoride gas.

19. An ion-plating process of forming an amorphous silicon film comprising the steps of:
(a) positioning a source of film material and a substrate in a chamber with said source connected into an electrical circuit as an anode and said substrate connected into said circuit as a cathode,
(b) interposing a high frequency electrode between said anode and cathode,
(c) energizing said high frequency electrode with sufficient energy to generate a high frequency electric field, whereby the negative charge of said cathode attracts said ions to plate said substrate, (d) evaporating said source of film material to produce a film material gas, and (e) ionizing said film material gas under said high frequency electric field and in a gas pressure within said chamber which precludes any sputtering of said source of film material when said high frequency electric field is generated, whereby the negative charge of said cathode attracts the ionized film materials to plate said substrate.

20. The process of claim 19 wherein said chamber is a vacuum chamber and the added step of reducing the pressure in said chamber to said gas pressure.

21. The process of claim 19 and the added step of accelerating said ions toward said cathode.

22. The process of claim 19 and the added step of reducing the pressure in said chamber to a pressure range of $1 \times 10^{-4}$ to $3 \times 10^{-2}$ Torr.

23. The process of claim 19 and the added step of introducing silicon tetrafluoride gas into said chamber during the energization of said high frequency electrode.

* * * * *